(12) United States Patent
Grimaldi et al.

(10) Patent No.: US 6,518,815 B2
(45) Date of Patent: Feb. 11, 2003

(54) POWER DEVICE WITH PROTECTION AGAINST UNDESIRABLE SELF-ACTIVATION

(75) Inventors: Antonio Grimaldi, Mascalucia (IT); Luigi Arcuri, Misterbianco (IT); Salvatore Pisano, Gela (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/759,599

(22) Filed: Jan. 11, 2001

(65) Prior Publication Data

US 2001/0022525 A1 Sep. 20, 2001

(30) Foreign Application Priority Data

Jan. 20, 2000 (EP) ............................................. 00830028

(51) Int. Cl.[7] ................................................. H03K 5/08
(52) U.S. Cl. ...................... 327/310; 327/313; 327/314; 327/324; 327/327; 327/380; 361/54; 361/111
(58) Field of Search .................................. 327/310–314, 327/375, 376, 377, 380, 324–327; 361/54, 56, 91.1, 91.5, 111

(56) References Cited

U.S. PATENT DOCUMENTS

| | | | | |
|---|---|---|---|---|
| 3,562,547 A | * | 2/1971 | Brode et al. .................. 327/324 |
| 4,492,883 A | | 1/1985 | Janutka ......................... 327/377 |
| 4,493,000 A | * | 1/1985 | Edwards ........................ 361/92 |
| 4,855,620 A | * | 8/1989 | Duwury et al. ................ 361/91 |
| 4,875,130 A | * | 10/1989 | Huard ............................ 361/56 |
| 5,041,889 A | * | 8/1991 | Kriedt et al. .............. 357/23.13 |
| 5,521,789 A | * | 5/1996 | Ohannes et al. ............. 361/111 |
| 5,717,560 A | * | 2/1998 | Doyle et al. ................... 361/56 |

FOREIGN PATENT DOCUMENTS

| | | |
|---|---|---|
| EP | 0602708 A2 | 6/1994 |
| EP | 0703664 A2 | 3/1996 |

* cited by examiner

*Primary Examiner*—Timothy P. Callahan
*Assistant Examiner*—An T. Luu
(74) *Attorney, Agent, or Firm*—Lisa K. Jorgenson; E. Russell Tarleton; SEED IP Law Group PLLC

(57) ABSTRACT

A MOS-type power device having a drain terminal, a source terminal, and a gate terminal; and a protection circuit having a first conduction terminal connected to the gate terminal, via a diffused resistor, and a second conduction terminal connected to the source terminal. The protection circuit has a resistance variable between a first value and a second value according to the operating condition of the power device. In a first embodiment of the protection circuit, an ON-OFF switch made by means of a horizontal MOS transistor has a control terminal connected to the drain terminal of the power device. In a second embodiment of the protection circuit, the ON-OFF switch is replaced with a gradual-intervention switch made by means of a P-channel JFET transistor having a control terminal connected to the gate terminal of the power device.

16 Claims, 4 Drawing Sheets

POWER DEVICE WITH PROTECTION AGAINST UNDESIRABLE SELF-ACTIVATION

TECHNICAL FIELD

The present invention pertains a power device with protection against undesirable self-activation.

BACKGROUND OF THE INVENTION

As is known, power devices are able to manage high voltages and currents. However, external causes, such as disturbances that are created on the supply networks, may lead to these quantities exceeding the maximum values that can be withstood by these devices or may even modify the electrical stability of the circuits in which these devices are inserted.

In automotive applications, power devices are required that are able to prevent malfunctioning of any nature. For example, in ABS devices an accidental disconnection may occur of the gate terminal of the power device from the control unit located on the motor vehicle. In fact, if the gate terminal of the power device remains floating, its potential may reach, by capacitive coupling, the potential applied to the drain terminal of the device itself. This causes self-activation of the power device at drain voltages that are well below the desired value, with consequent flow of current. In order to prevent this from happening and in order for the power device to be able to withstand high drain voltages, it is therefore necessary for the gate terminal never to remain floating, but to be always connected, for example, to the source terminal of the device itself.

In addition, it is necessary to keep the costs for manufacture of the power device low, by keeping the process of its integration simple to implement both in terms of masks to be used and in terms of process steps to be performed.

A known power device 1 is shown in FIG. 1 and comprises a vertical transistor of the MOS type having a gate terminal 2 and a source terminal 3 connected together via a diffused resistor 5 having a resistance R. The gate terminal 2 is also connected to a control unit 10, which is shown only schematically in FIG. 1 and comprises known driving circuits that supply a driving signal to the power device 1. The diffused resistor 5 and the power device 1 are made in one and the same chip 20. In particular, the diffused resistor 5 is formed in the proximity of the gate pad of the power device 1 by doping, with N-type impurities, a polysilicon portion previously enriched with P-type impurities.

Although this known solution is simple to implement and is economically competitive, it does not prevent undesirable turning-on of the power device 1. In fact, for proper operation of the power device 1, the resistance R must have a high value. Specifically, when the gate terminal 2 receives the driving signal from the control unit 10, the value of the resistance R should be such as not to absorb the charge supplied to the gate terminal 2. On the other hand, when the control unit 10 does not supply the driving signal, thus leaving the gate terminal 2 floating, the resistance R should have a low value so as to short-circuit the gate terminal 2 and source terminal 3 of the power device 1, thus keeping it turned off. Since the two requirements referred to above are mutually incompatible, it is not possible to have a power device that operates correctly and is protected from self-activation.

At present, in order to prevent the phenomenon of electrostatic charges, a first Zener diode 6 and a second Zener diode 7 are mutually connected in anti-series between a drain terminal 4 of the power device 1 and the gate terminal 2; in addition, a third Zener diode 8 and a fourth Zener diode 9 are mutually connected in anti-series between the gate terminal 2 and the source terminal 3 of the device itself. However, also this circuit arrangement fails to prevent self-activation of the power device 1, given that the breakdown voltage of the Zener diodes 6 and 7 must be higher than the driving voltage required for turning on the power device I during normal operation.

SUMMARY OF THE INVENTION

The disclosed embodiments of the present invention are directed at solving the technical problems referred to above by providing a power device that is protected against undesirable self- activation.

The foregoing problems are solved by a power device that includes a first conduction terminal and a second conduction terminal, and control terminal; a variable-resistance protection circuit having a first conduction terminal and a second conduction terminal connected, respectively, to the control terminal and to the second conduction terminal of the power device, the protection circuit having a resistance variable between a first value and a second value according to an operating condition of the power device.

In accordance with another embodiment of the invention, a circuit is provided that includes a power transistor having a drain terminal, a source terminal, and a control terminal to receive a driving signal; and a protection circuit having an electric static charge prevention circuit and a switch resistance circuit coupled to the drain, source, and control terminals of the power transistor, the switch resistor circuit configured to electrically connect the control terminal to the source terminal of the power transistor in the absence of a driving signal on the control terminal and in the presence of a voltage on the control terminal having a greater value than the threshold voltage of the power transistor.

In accordance with another aspect of the present invention, a method for protecting a power transistor from unwanted self-activation is provided, the power transistor having a control terminal, drain terminal, and source terminal, the method including: sensing the absence of a driving voltage on the control terminal of the power transistor; and coupling a resistance between the control terminal and source terminal of the power transistor when the voltage on the gate terminal is greater than the threshold voltage of the power transistor. Ideally, sensing the absence of a driving voltage includes sensing the presence of a voltage on the gate terminal that is greater than the threshold voltage of the power transistor.

In accordance with another aspect of the foregoing method, the coupling includes automatically switching on a switch coupled in series with a resistance between the control terminal and the source terminal of the power transistor. The switching includes having the control terminal of the switch coupled to the drain terminal of the power transistor and automatically turning on the switch when the voltage on the drain terminal increases to the threshold voltage of the switch.

BRIEF DESCRIPTION OF THE DRAWINGS

The characteristics and advantages of the embodiments of the power device according to the invention will emerge clearly from the ensuing description of examples of embodiments which are given simply to provide a non-limiting illustration, with reference to the attached drawings, in which.

DETAILED DESCRIPTION OF THE INVENTION

Figure 1:
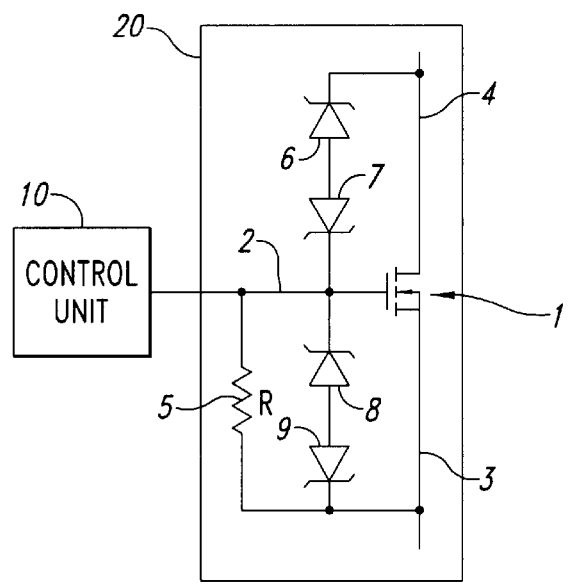
FIG. 1 presents a circuit diagram of a known power device.
Figure 2:
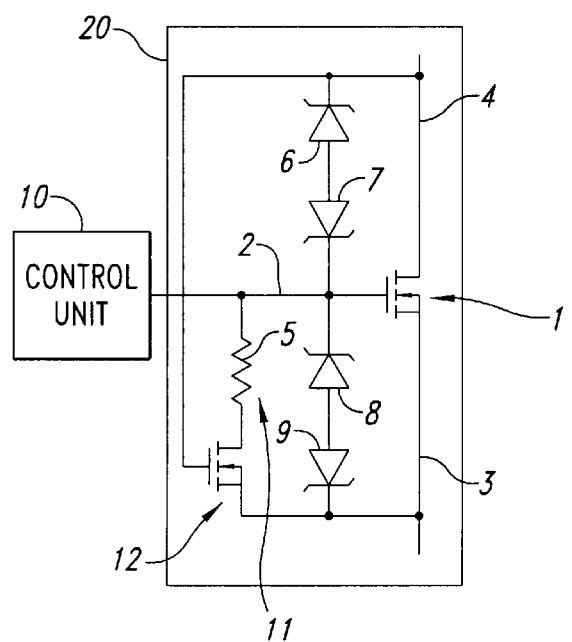
FIG. 2 presents the circuit diagram of a first embodiment of a power device according to the invention.

In FIG. 2, the power device of FIG. 1 is equipped with a protection circuit 11 connected between the gate terminal 2 and the source terminal 3 of the device. A first embodiment of the protection circuit 11 comprises the diffused resistor 5 connected in series to an ON-OFF switch 12. In greater detail, the ON-OFF switch 12 is made using a MOS transistor of the horizontal type having a first conduction terminal connected, via the diffused resistor 5, to the gate terminal of the power device 1, a second conduction terminal connected to the source terminal 3 of the power device 1, and a control terminal connected to the drain terminal 4.

The diffused resistor 5 is formed in the same chip 20 as the power device 1, in the vicinity of the gate pad of the device itself, and has a resistance R of approximately kΩ. Also made in the chip 20 is the MOS transistor 12, using two different integration techniques according to the maximum voltage value to which the power device 1 may be subjected.

Figure 5:
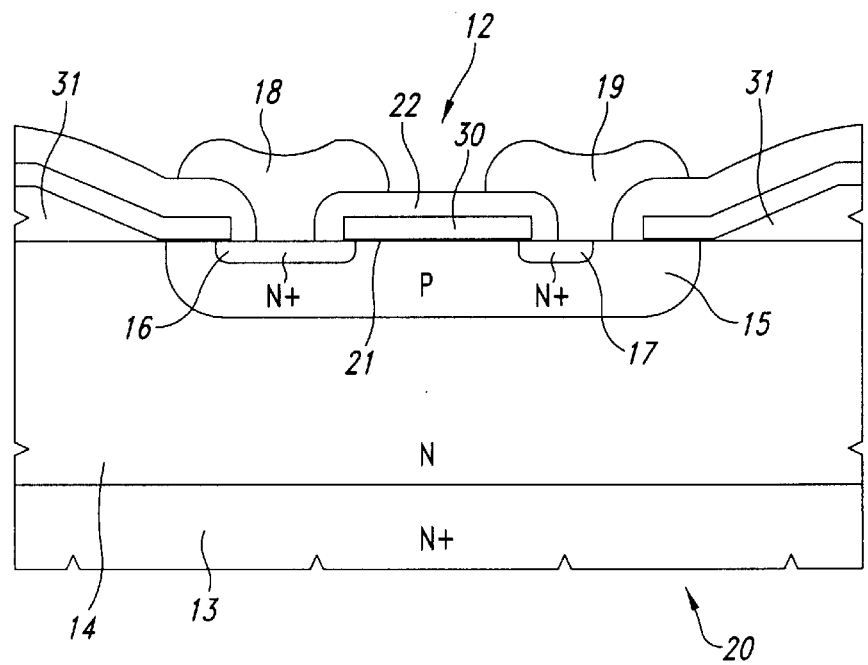
FIGS. 5 and 6 show cross sections through a chip incorporating a portion of the power device of FIG. 2.
Figure 6:
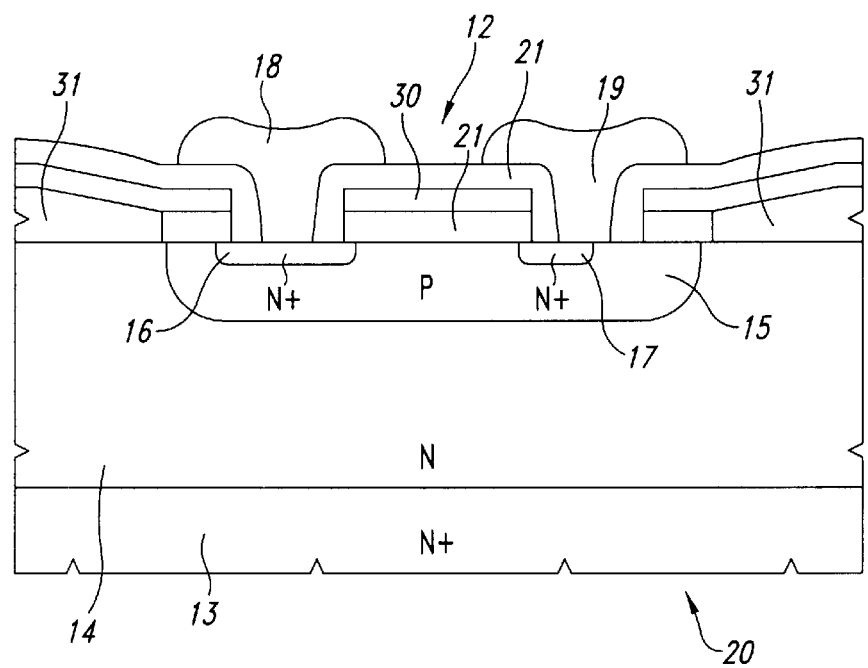

In particular, FIGS. 5 and 6 show cross sections of the chip 20 incorporating the MOS transistor 12, according to two different embodiments. In detail, in both FIGS. 5 and 6 the chip 20 comprises a substrate 13 on top of which an epitaxial layer 14 is formed. The epitaxial layer 14 houses a body region 15 of the MOS transistor 12, in which a drain region 16 and a source region 17 of the transistor itself are formed. The drain region 16 and the source region 17 are in electrical contact, respectively, with a drain metallization region 18 and with a source metallization region 19. Formed on top of the body region 15 is a gate region 30 isolated from the body region 15 by means of a gate oxide layer 21. An insulating dielectric 22 covers the gate region 30, insulating it from the drain metallization region 18 and the gate metallization region 19. Thick field-oxide portions 31, set at the sides of the body region 15, protect the edges of the MOS transistor 12. In particular, if the power device 1 is to withstand maximum voltages that are not particularly high, the MOS transistor 12 and the power device 1 are made using the same gate-oxide layer 21 (FIG. 5). If the power device 1 is to withstand rather high voltages, the MOS transistor 12 is made with a gate-oxide layer 21 of its own having an adequate thickness (FIG. 6).

Electrical access to the chip 20 is via the gate terminal 2, source terminal 3, and drain terminal 4 of the power device 1 (FIG. 2).

Operation of the power device 1 of FIG. 2 is described as follows.

When the gate terminal 2 of the power device 1 receives the driving signal, the power device 1 is turned on, and the potential applied to the drain terminal 4 decreases, thus sending the MOS transistor 12 below the threshold value. In this way, the MOS transistor 12 disconnects the gate terminal 2 from the source terminal 3 of the power device 1.

When the control unit 10 does not supply the driving signal, the gate terminal 2 of the power device 1 remains floating. In such conditions, the protection circuit 11 does not act, and the gate terminal 2, on account of capacitive coupling or on the account of the presence of electrostatic charges, reaches voltages that are higher than the threshold voltage of the power device 1, thus causing self-activation of the device itself, with consequent passage of the drain current ID This anomaly is eliminated by the intervention of the protection circuit 11. In fact, in the absence of the driving signal, the potential applied to the drain terminal 4 increases, so causing turning-on of the MOS transistor 12, which electrically connects the gate terminal 2 and the source terminal 3. In this way, the gate terminal 2 is blocked at the value of the potential applied to the source terminal 3, thus causing turning-off of the power device 1 in a stable way.

Figure 3:
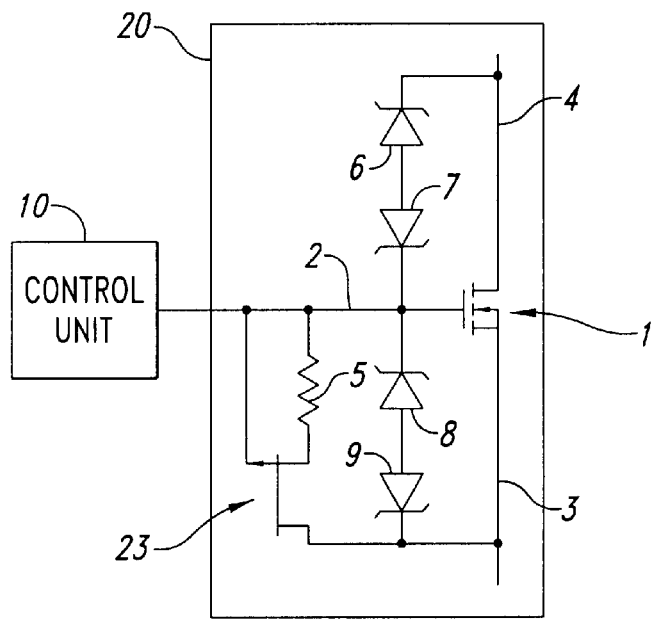
FIG. 3 presents the circuit diagram of a second embodiment of a power device according to the invention.

FIG. 3 illustrates a second embodiment of the protection circuit 11, in which the MOS transistor 12 is replaced by a gradual-action switch 23. In greater detail, the gradual-intervention switch 23 comprises a P-channel JFET transistor which behaves like a voltage-variable resistor and has a first conduction terminal connected, via the diffused resistor 5, to the gate terminal 2 of the power device 1, a second conduction terminal connected to the source terminal 3 of the power device 1, and a control terminal connected to the gate terminal 2 of the device itself.

Figure 7:
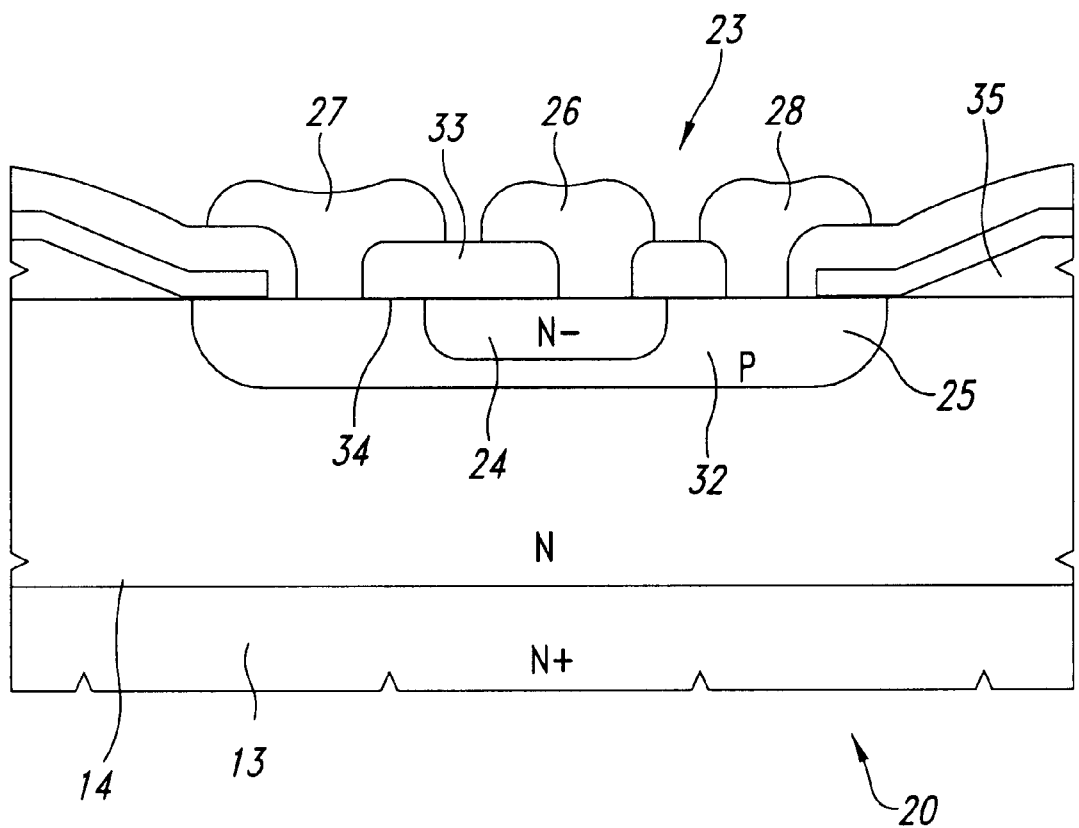
FIG. 7 shows a cross section through a chip incorporating a portion of the power device of FIG. 3.

The protection circuit 11 is formed on an area of the chip 20 set in a part corresponding to the gate pad of the power device 1, after removal of a portion of field oxide that covered that area. In particular, FIG. 7 shows a cross section of the chip 20 incorporating the JFET transistor 23. In detail, the JFET transistor 23 comprises a gate region 24 housed in a well 25 formed in the epitaxial layer 14. A portion 32 of the well 25 located beneath the gate region 24 forms the channel region of the JFET transistor 23. When a potential is applied to the gate region 24, it modulates the channel region 32. In addition, the gate region 24 is in electrical contact via a gate metallization region 26 which, in turn, is connected to the control terminal of the JFET transistor 23 (FIG. 3). The well 25 is in electrical contact via a drain metallization region 27 and a source metallization region 28 which are set on opposite sides of the gate metallization region 26 and are, in turn, connected, respectively, to the first conduction terminal and to the second conduction terminal of the JFET transistor 23 (FIG. 3). An insulating dielectric 33 covers portions 34 of the well 25 and of the gate region 24 which are not in electrical contact with the metallization regions 26, 27, 28, insulating the former from the latter. Thick field-oxide portions 35, set at the sides of the well 25, protect the edges of the JFET transistor 23. Also in this case, electrical access to the chip 20 is via the gate terminal 2, source terminal 3, and drain terminal 4 of the power device 1 (FIG. 3).

Operation of the power device 1 of FIG. 3 is described in what follows.

Figure 4:
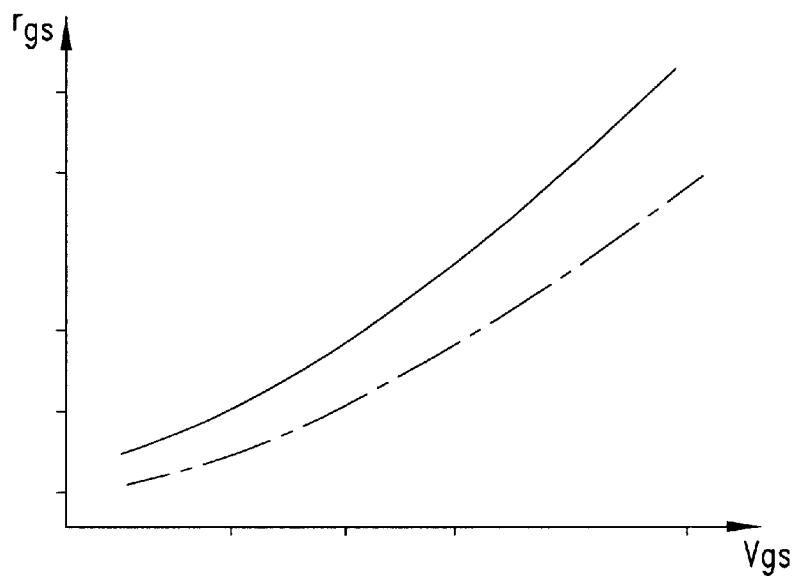
FIG. 4 shows the plot of an electrical quantity taken on the power device of FIG. 3.

When the gate terminal 2 of the power device 1 receives the driving signal, to the control terminal of the JFET transistor 23 is applied a voltage $V_{gs}$ (voltage present between the gate terminal 2 and source terminal 3 of the power device 1) of a value such as to cause pinch-off of the JFET transistor 23. In these conditions, the JFET transistor 23 behaves like a resistor with a resistance $r_{gs}$ having a sufficiently high value (pinched resistor). In this connection, reference is made to FIG. 4 which shows, as a function of the voltage $V_{gs}$, the plot of the resistance $r_{gs}$ for two different values of the temperature T (T=25° represented by a continuous line, and T=175° represented by a dashed-anddotted line). This high value of the resistance $r_{gs}$ causes electrical isolation of the gate terminal 2 and source terminal 3 of the power device.

When the control unit 10 does not supply the driving signal, so leaving the gate terminal 2 floating, no voltage is applied to the control terminal of the JFET transistor 23, and consequently the resistance $r_{gs}$ has a very low value. The gate terminal 2 of the power device 1 thus reaches the same potential as that of the source terminal 3, so causing turning-off of the device itself.

The power device 1 described herein affords the advantages illustrated in what follows. In the first place, the power device 1 is protected, by means of the protection circuit 11, against undesirable self-activation. In addition, the power device 1 can operate correctly, in that the protection circuit 11, in normal operating conditions, behaves like an open circuit with respect to the charge supplied to the gate terminal 2 by the control unit 10.

In addition, the circuit application in which the power device according to the invention is employed affords considerable advantages in terms of safety and in terms of reliability, these being extremely important factors if the device is used for automotive applications.

Furthermore, the protection circuit 11 is easy to construct and can be integrated using the same techniques as those used for integrating the power device 1, thus keeping the fabrication costs low.

Finally, it is clear that numerous variations and modifications may be made to the power device 1 described and illustrated herein, all falling within the sphere of the inventive idea, as defined in the attached claims.

In particular, the MOS transistor 12 or the JFET transistor 23 may be replaced, for example, by a bipolar-type transistor.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. A MOS-type protected power device, comprising: a power device having vertical conduction with a first body and comprising a first conduction terminal and a second conduction terminal, and a control terminal; and a variable-resistance protection circuit having horizontal conduction with a second body different from the first body of the power device and comprising a first conduction terminal and a second conduction terminal connected, respectively, to said control terminal and to said second conduction terminal of said power device, said protection circuit having a resistance variable between a first value and a second value according to an operating condition of said power device, the resistance coupled between the first conduction terminal of the protection circuit and the control terminal, the protection circuit configured to electrically connect the control terminal of the power device to the second conduction terminal of the power device in the absence of a driving signal on the control terminal and in the presence of a voltage supplied to the protection circuit from the power device.

2. The device of claim 1, wherein said protection circuit comprises switching means.

3. The device of claim 2, wherein switching means comprise an ON-OFF switch.

4. The device of claim 3, wherein said ON-OFF switch comprises a MOS transistor of the horizontal type, having a first conduction terminal and a second conduction terminal that are connected, respectively, to said first conduction terminal and second conduction terminal of said protection circuit, and a control terminal connected to said first conduction terminal of said power device.

5. The device of claim 4, wherein said horizontal MOS transistor is an N-channel transistor.

6. The device of claim 2, wherein said switching means comprise a gradual-intervention switch.

7. The device of claim 5, wherein said gradual-intervention switch comprises a JFET transistor having a first conduction terminal and a second conduction terminal that are connected, respectively, to said first conduction terminal and second conduction terminal of said protection circuit, and a control terminal connected to said control terminal of said power device.

8. The device of claim 6, wherein said JFET transistor is a P-channel transistor.

9. The circuit of claim 1, wherein the transistor of the switched resistance circuit is configured to be turned off in the presence of a driving signal on the control terminal of the power transistor and configured to switch on in the presence of a voltage from the drain terminal of the power transistor that is greater than the threshold voltage of the switched resistance circuit transistor.

10. The circuit of claim 9, wherein the electrostatic charge protection circuit comprises a first and second diode coupled in anti-series between the control and source terminals of the power transistor and a third and fourth diode coupled in anti-series between the control and drain terminals of the power transistor.

11. The circuit of claim 9, wherein the transistor of the switched resistance circuit comprises a JFET transistor.

12. The method of claim 4, wherein coupling a resistance comprises automatically coupling the resistance.

13. The method of claim 12, wherein automatically coupling comprises automatically switching on a switch coupled in series with a resistance between the control terminal and the source terminal of the power transistor when a voltage on the drain terminal reaches a predetermined value.

14. The method of claim 12, wherein automatically coupling comprises automatically switching on a transistor coupled in series with a resistance between the control terminal and the source terminal of the power transistor when a voltage on the drain terminal of the power transistor coupled to a gate terminal of the transistor reaches a threshold value of the transistor.

15. A circuit comprising:

a power transistor having a drain terminal, a source terminal, and a control terminal to receive a driving signal;

a protection circuit having an electrostatic charge prevention circuit and a switched resistance circuit coupled to the power transistor, the switched resistance circuit configured to electrically connect the control terminal to the source terminal of the power transistor in the absence of a driving signal on the control terminal and in the presence of a voltage supplied to the switch resistance circuit from the power transistor, the switched resistance circuit comprises a transistor having a control terminal coupled to the drain terminal of the power transistor, a first conduction terminal coupled to the control terminal of the power transistor via a resistive element, and a second conduction terminal coupled to the source terminal of the power transistor.

16. A method for protecting a power transistor from unwanted self-activation, the power transistor having a control terminal, a drain terminal, and a source terminal, the method comprising:

sensing the absence of a driving voltage on the control terminal of the power transistor and sensing a voltage on the drain terminal of the power transistor ; and coupling a resistance between the control terminal and the source terminal of the power transistor when the voltage on the power transistor reaches a predetermined value, comprising coupling the resistance when the voltage on the drain terminal reaches a threshold voltage of a transistor coupled in series with the resistance between the control terminal and the source terminal of the power transistor.

\* \* \* \* \*

UNITED STATES PATENT AND TRADEMARK OFFICE
CERTIFICATE OF CORRECTION

PATENT NO. : 6,518,815 B2 Page 1 of 1
APPLICATION NO. : 09/759599
DATED : February 11, 2003
INVENTOR(S) : Antonio Grimaldi et al.

It is certified that error appears in the above-identified patent and that said Letters Patent is hereby corrected as shown below:

Column 6
Line 21, "The circuit of claim 1,..." should read as --The circuit of claim 15,...--.
Line 36, "The method of claim 4,..." should read as --The method of claim 16,...--.

Signed and Sealed this

Twenty-second Day of January, 2008

JON W. DUDAS
*Director of the United States Patent and Trademark Office*